United States Patent [19]
Carver

[11] Patent Number: 6,166,605
[45] Date of Patent: Dec. 26, 2000

[54] INTEGRATED AUDIO AMPLIFIER

[76] Inventor: Robert W. Carver, 330 Avenue "A", Snohomish, Wash. 98290

[21] Appl. No.: 09/156,329

[22] Filed: Sep. 18, 1998

Related U.S. Application Data

[60] Provisional application No. 60/059,220, Sep. 18, 1997.

[51] Int. Cl.[7] ....................................................... H03F 3/04
[52] U.S. Cl. .......................................... 330/297; 381/120
[58] Field of Search .................................... 330/297, 251, 330/207 A, 10; 381/120

[56] References Cited

U.S. PATENT DOCUMENTS

| | | | |
|---|---|---|---|
| 3,828,267 | 8/1974 | Tsurushima | 330/295 |
| 4,651,112 | 3/1987 | Keysor | 330/297 |
| 5,847,610 | 12/1998 | Fujita | 381/120 |

*Primary Examiner*—Robert Pascal
*Assistant Examiner*—Khanh Van Nguyen

*Attorney, Agent, or Firm*—Robert B. Hughes; Hughes & Schacht, P.S.

[57] ABSTRACT

An audio amplifier having an amplifier section and a power supply. The power supply comprises a positive power supply section and a negative power supply section, each of which provides voltage to the positive and negative power inputs to the amplifier. The control circuitry for the power supply sections causes the voltage output from the power supply sections to vary in accordance with the amplitude of the audio signal so that the power supply voltages track the positive and negative components of the audio signal so that the supply voltages are at a predetermined level above and below the positive and negative components of the audio signal, respectively. Each of the power supply sections has a pair of switches which open and close alternately to transmit power pulses to opposite ends of the primary winding, and the secondary winding in turn transmit power pulses alternately through a filter component to its respective input of the amplifier section.

20 Claims, 12 Drawing Sheets

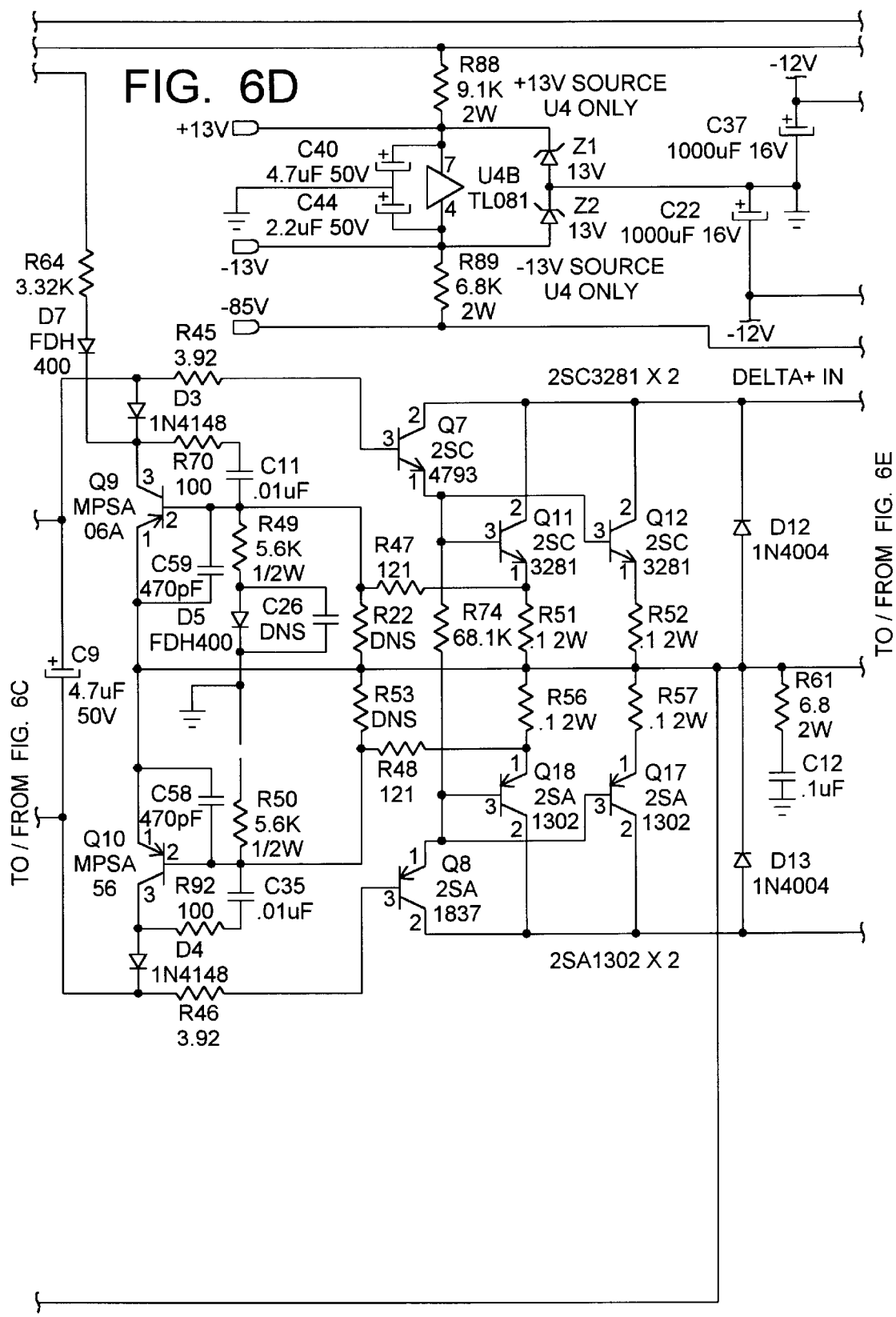

INTEGRATED AUDIO AMPLIFIER

This application claims priority of U.S. Provisional Patent Application Ser. No. 60/059,220, which was filed on Sep. 18, 1997.

BACKGROUND OF THE INVENTION a) Field of the Invention

The present invention relates to an audio amplifier and more particularly an audio amplifier which is capable of producing relatively high power output, while operating with relatively low power losses, and also being of relatively small size.

b) Background Art

An audio signal is characterized in that it comprises what might be called a series of "peaks and valleys". There are periods of high amplitude (the peaks) and also those periods of relatively low amplitude (the valleys). The total of the time periods for the "peaks" is in most all instances rather small, compared to the total of the time periods for the valleys. This is true even of music which would be considered consistently loud music, such as hard rock.

This imposes somewhat unique problems in the design of audio amplifiers, and yet provides opportunities for technical improvements. Thus, it is the object of the present invention to provide an improved audio amplifier which is of a relatively small size, operates quite efficiently, is relatively inexpensive to manufacture, and yet is capable of faithful amplification of audio signals.

SUMMARY OF INVENTION

The audio amplifier of the present invention is able to deliver relatively high power output (2,000 watts or more) and yet be small in size and operate with relatively high efficiency.

This amplifier comprises a power amplifier section which receives an audio input signal and positive and negative inputs to produce an audio output. There is also a power supply comprising a positive power supply section and a negative power supply section.

The positive power supply section comprises a transformer having a primary and a secondary winding, with a secondary winding being connected to the power amplifier section to supply positive voltage power input to the power amplifier section.

There is a power switch means to supply current pulses to the primary winding. There is also a filter circuit component connected to an output of the secondary winding of the transformer to maintain the voltage of the positive power output as a continuing variable voltage input.

There is also a control circuit responsive to an audio input signal to transmit a pulsed control signal to the switch means to cause the switch means to open and close in a manner to transmit current pulses to the primary winding of the transformer. The pulses have a proportional relationship to the strength of the audio signal, so that the positive voltage input to the amplifier section tracks the audio signal in a manner to maintain the positive input voltage at a predetermined level range above voltage of the audio input.

The negative supply section also comprises a transformer, a second power switch means, a filter circuit component, and a control circuit. However, the negative power supply section provides a negative voltage power input to the power amplifier at a voltage below the audio signal voltage by a predetermined amount. In other respects, the negative power supply section is constructed and operates in substantially the same manner as the positive power supply section.

The switch means for each of the power supply sections comprises two switches connected to opposite sides of the primary winding of the transformer. Thus, the pulses of one of these switches passes through the related primary winding in one direction, while the pulses of the other switch pass through the related primary winding in an opposite direction. In the preferred configuration, an intermediate portion of each of the primary windings in connected to a power source.

Also, the secondary winding in the preferred configuration is connected to ground at an intermediate location of each secondary winding.

Each control circuit comprises a pulse width modulator which receives a clock input to initiate successive pulse signals. The pulse width modulator also has an audio signal input to cause the pulse width modulator to transmit pulse signals having a pulse strength with a proportional relationship to the audio signal.

Desirably, the pulse width modulator creates square wave signal pulses, with the width of the pulses varying in accordance to the amplitude of the audio signal.

Each secondary winding of the two power supply sections has two end connections and first and second diodes to receive the output at each of the end connections with the output of the diodes being directed to the power amplifier section.

The control circuit operates to close each set of first and second switches alternately, so that the current pulses from each secondary winding are transmitted alternately through the first and second diodes.

In the preferred form, each filter circuit component comprises an induction coil to receive the output of the secondary, and a capacitor connected at a location between the induction coil and the amplifier section.

In the method of the present invention, an audio amplifier is provided as noted above. Each pulse width modulator transmits pulses to the first and second switches of each power supply section, with the width of the pulses having a proportional relationship to the amplitude of the audio signal. The pulses from each set of switches is transmitted to its related transformer, which in turn transmit these pulses through the related filter circuit component and thence to the amplifier.

Other features will become apparent from the following detailed description.

BRIEF DESCRIPTION OF THE DRAWINGS

FIGS. 4A-1 and 4B-1 are more detailed drawings of the circuit for the positive power supply;

FIGS. 4A-2 and 4B-2 are more detailed drawings of the circuit for the negative power supply;

FIGS. 6A, 6B, 6C, 6D and 6E are a more detailed presentation of the circuitry of the power amplifier of the present invention.

DESCRIPTION OF THE PREFERRED EMBODIMENTS

Figure 1:
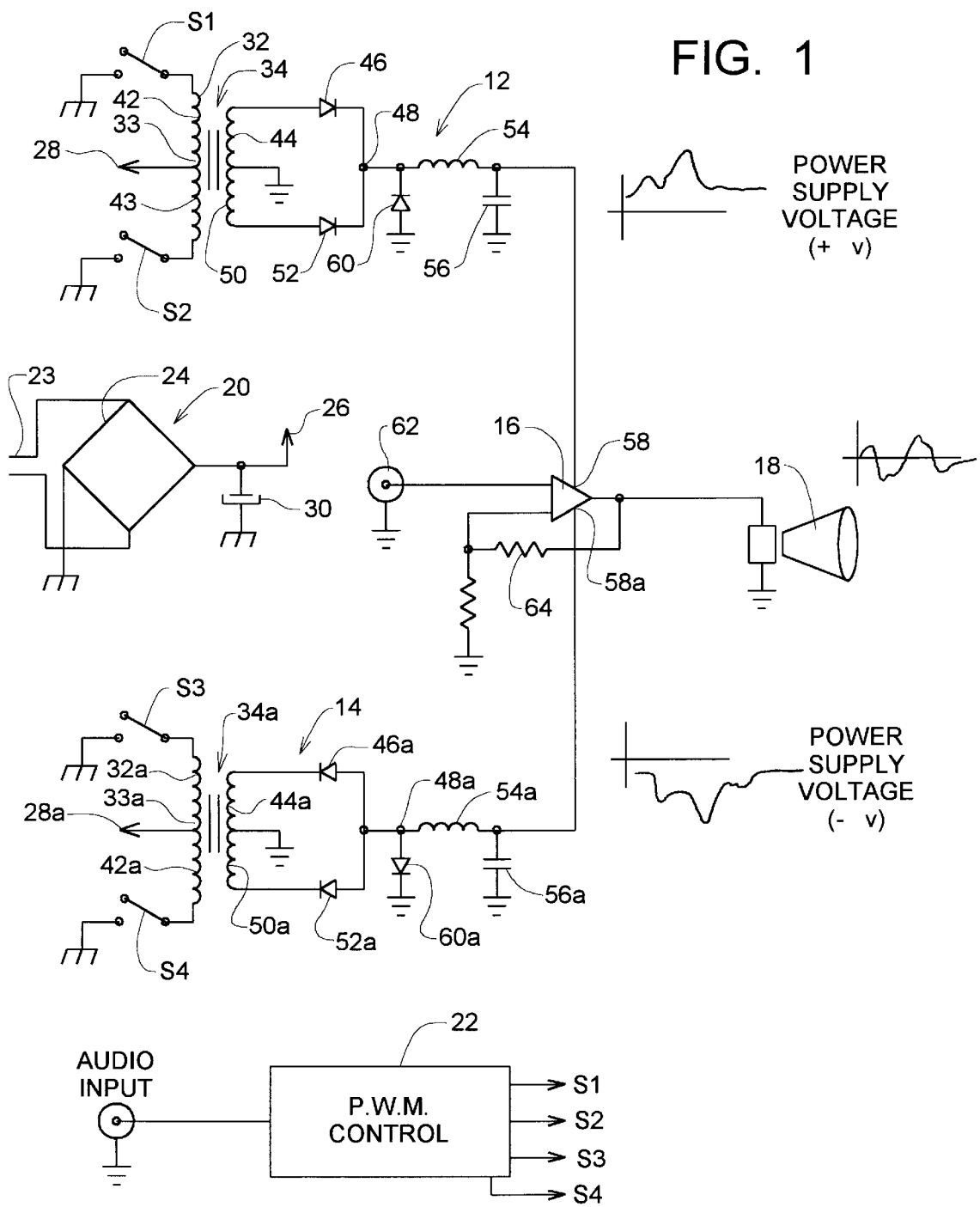
FIG. 1 is a schematic drawing of the present invention.

Reference will first be made to FIG. 1 which shows somewhat schematically the entire amplifier 10 of the present invention. This amplifier 10 of the present invention comprises first and second power sections 12 and 14 and an amplifier unit 16 which receives power from the two power sections 12 and 14. The amplifier in turn drives a speaker 18. The amplifier further comprises a source of DC power, generally designated 20, and a P.W.M. control unit 22 (i.e. a pulse width modulation control unit).

The power source 20 derives its power from a conventional wall plug 23 which directs current through a rectifying bridge 24 to provide a DC output at 26 which is directed into the poser inputs 28 and 28a of each of the two power sections 12 and 14. The power source 20 is provided with a capacitor 30 to minimize the variations in the DC output.

The two power sections 12 and 14 are substantially identical, except that the power section 12 supplies power only for the positive portions of the audio signal, and the other power section 14 provides power for the negative portions of the audio signal. Accordingly, only the power section 12 will be described, with the understanding that the same description applies to the other power section 14. The components of the second power section 14 will be given designations the same as those given in the first power section 12 for corresponding components, with an "a'" suffix distinguishing those of the second power section.

The power input 28 is connected at 33 to the middle of the primary winding 32 of a transformer 34. The secondary winding 36 of the transformer is connected from its mid point to ground at 38. The upper part 40 of the primary winding 32 is connected through to a first control switch S1 to ground. The other half 42 of the primary winding 32 connects from the power input 28 to a related switch S2 to ground. The two switches S1 and S2 are closed and opened in an alternating fashion, in this preferred embodiment at a frequency of 160 kHz.

As will be described more fully later herein, these two switches S12 and S2 are duty cycle modulated, so that if greater power is required, each of the switches S1 and S2 are closed for longer periods of time during each cycle to create pulses of longer duration on the respective half cycle of each, and during periods of lower power requirements, the two switches S1 and S2 will close for only shorter periods of time to create pulses of very short duration.

The upper half 44 of the secondary winding 36 has one end connected to the center location 38, and the opposite end connected through a diode 46 to a junction point at 48. In like manner, the lower half 50 of the primary winding 36 connects from the center location 38 of the secondary 36 to a second diode 52 which in turn leads to the aforementioned junction location 48. The current from the junction location 48 leads through an inductance coil 54, with the output of the inductance coil 54 connecting to a capacitor 56. The coil 54 and capacitor 56 constitute a low pass filter to "smooth" the current. The current from the coil 52 is directed to the positive input terminal 58 of the amplifier unit 16. There is a diode 60 connected between the junction location 48 and the inductance coil 54. When one or the other of the diodes 46 and 52 shut off there is an inductance kick from the coil 54, and a diode 60 provides a path to ground.

As indicated above, the second power section 14 is the same as the first power section 12, except that it operates on the negative portions of the audio signal. Thus, the output from the second power section is directed to the power input connection at 58a to the amplifier unit 16.

The aforementioned control unit 22 is (or may be) conventional, and in this preferred embodiment comprises an integrated circuit which receives the audio signal from an outside source. It converts the analog audio signal into digital pulses that in turn operate the above mentioned two switches (S1 and S22) and also the corresponding switches S3 and S4 of the second power section 14. Since the same audio signal that operates the switches is applied to the input of the amplifier 16, the output of the control unit 22 will "track" the main audio signal. The control unit 22 is biased to stay just ahead of the main audio signal and has a relative output that is just "above" or "below", respectively, the plus and the negative portion of the audio signal.

As indicated above, the amplifier unit 16 is, or may be, of itself conventional. The audio input source for the simplifier unit 16 is indicated at 62, and the amplifier unit 16 has a feedback network indicated generally at 64.

To describe the overall operation of the present invention, as indicated earlier, the function of the power source 20 is to deliver DC current to the input 28 of the primary winding 32 of the transformer 34, with this being accomplished by directing the alternating current from the wall plug 22 through the rectifier bridge 24 and to the two inputs 28 and 28a of the first and second power supply sections 12 and 14. The capacitor 30 functions as a buffer and the DC current is maintained at a voltage relatively close to 165 volts.

The two switches S1 and S2 open and close alternately, this being controlled by the P.W.M. Control 22. The switching frequency is constant, and a preferred frequency is 160 kHz. On one half cycle when the switch S1 is closed (with the switch S2 being open), a pulse travels through the upper part 40 of the primary winding 32, and the pulse width is determined by the time period during which the switch S1 is closed. On the alternate half cycle during which the switch S2 is closed (with the switch S12 being open, the current pulse travels through the lower half 42 of the primary winding 32, and the pulse width is determined by the time period that the switch S2 is closed. The second power section 14 operates similarly. As indicated above, the pulse widths are duty cycle modulated. The operation of the P.W.M. Control 22 is controlled by the audio input, so that if the amplitude of the audio signal is low, the pulse widths are rather small. On the other hand, when the amplitude is high, the pulse width increases proportionately. Thus, when the switch S1 is closed, the pulse traveling through the upper half 40 of the primary winding 32 causes a pulse to travel through the upper half 44 of the secondary winding 36 through the diode 46, to the juncture point 48, then through the coil 54 and to the positive power input of the audio amplifier unit 16. On the other half cycle, the pulse travels through the lower half 42 of the primary winding 32 to cause a pulse of current to flow through a lower half 50 of the secondary winding 36, through the diode 52 to the junction 48, through the coil 54 and also to the positive input terminal 58 of the audio amplifier unit 16. These duty cycle modulated pulses are "averaged" by the coil 54 and the capacitor 56. As indicated above the voltage at the positive power input terminal 58 of the amplifier unit 16 remains just slightly ahead of, and slightly greater than, the voltage of the audio signal.

The operation of the second power supply section 14 is substantially the same as that of the first section 12, except that the two diodes 46a and 52a are reversed so that only negative pulses are delivered to the negative power input terminal 58a.

Figure 2A:
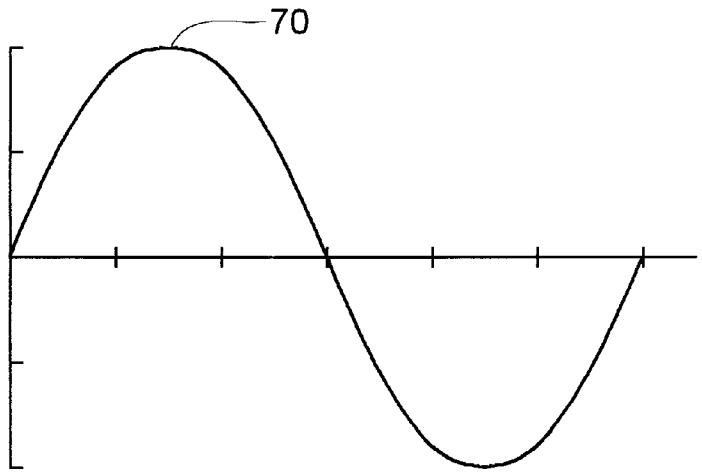
FIGS. 2A and 2B are diagrams illustrating the operation of the present invention, showing approximately the relative width of the pulses, corresponding to the amplitude of the audio signal.
Figure 2B:
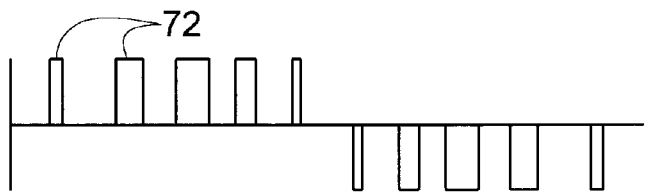

It will be noted that on one half cycle when the switch S1 is closed, the current through the primary winding 32 is in one direction, and then when the switch S2 is closed on the other halt cycle, the current is in the opposite direction. The practical effect of this is that there is alternating current passing through both the primary and secondary windings 32 and 36. To further illustrate the operation of the present invention, reference is made to FIGS. 2A and 2B. A portion of an audio signal which is to be amplified is shown in FIG. 2A, this being shown simply as a sine wave 70. There is shown the positive and negative half cycles. In FIG. 2B there are shown the positive and negative pulses which are generated by the two power input sections 13 and 14, these pulses being designated 72 and 74, respectively. It can be seen that the duration of the pulses is proportional to the amplitude of the audio signal.

Figure 3:
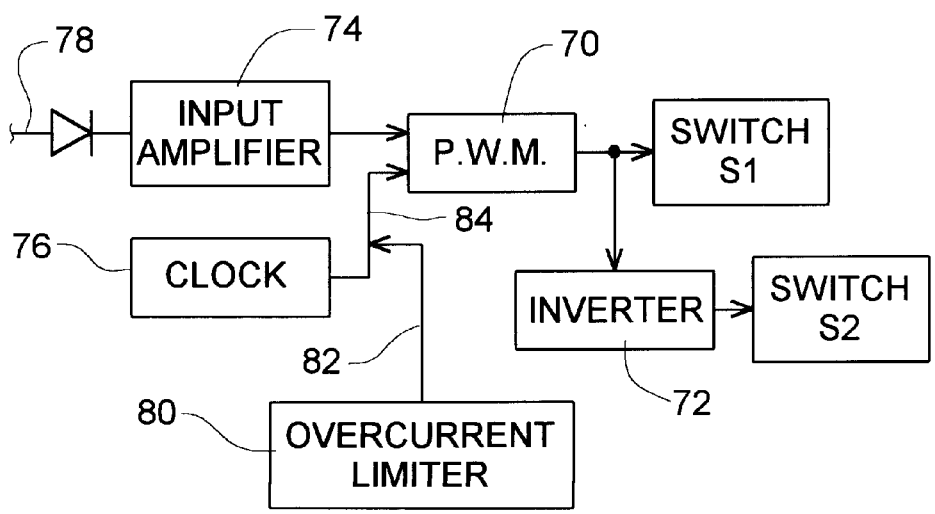
FIG. 3 is a schematic drawing of the circuit for the positive power supply of the amplifier.
Figures 1, 4A:
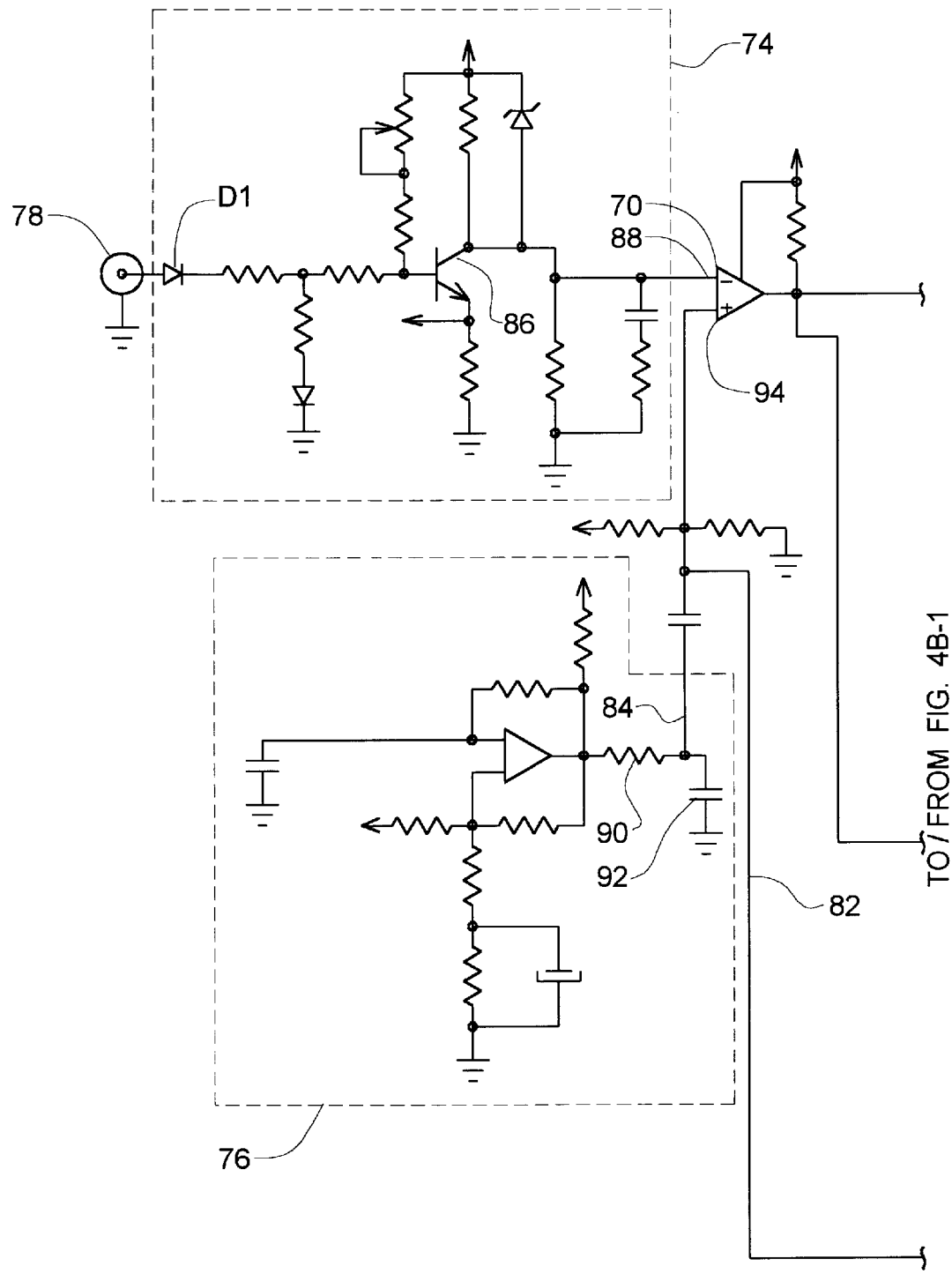
Figures 1, 4B:
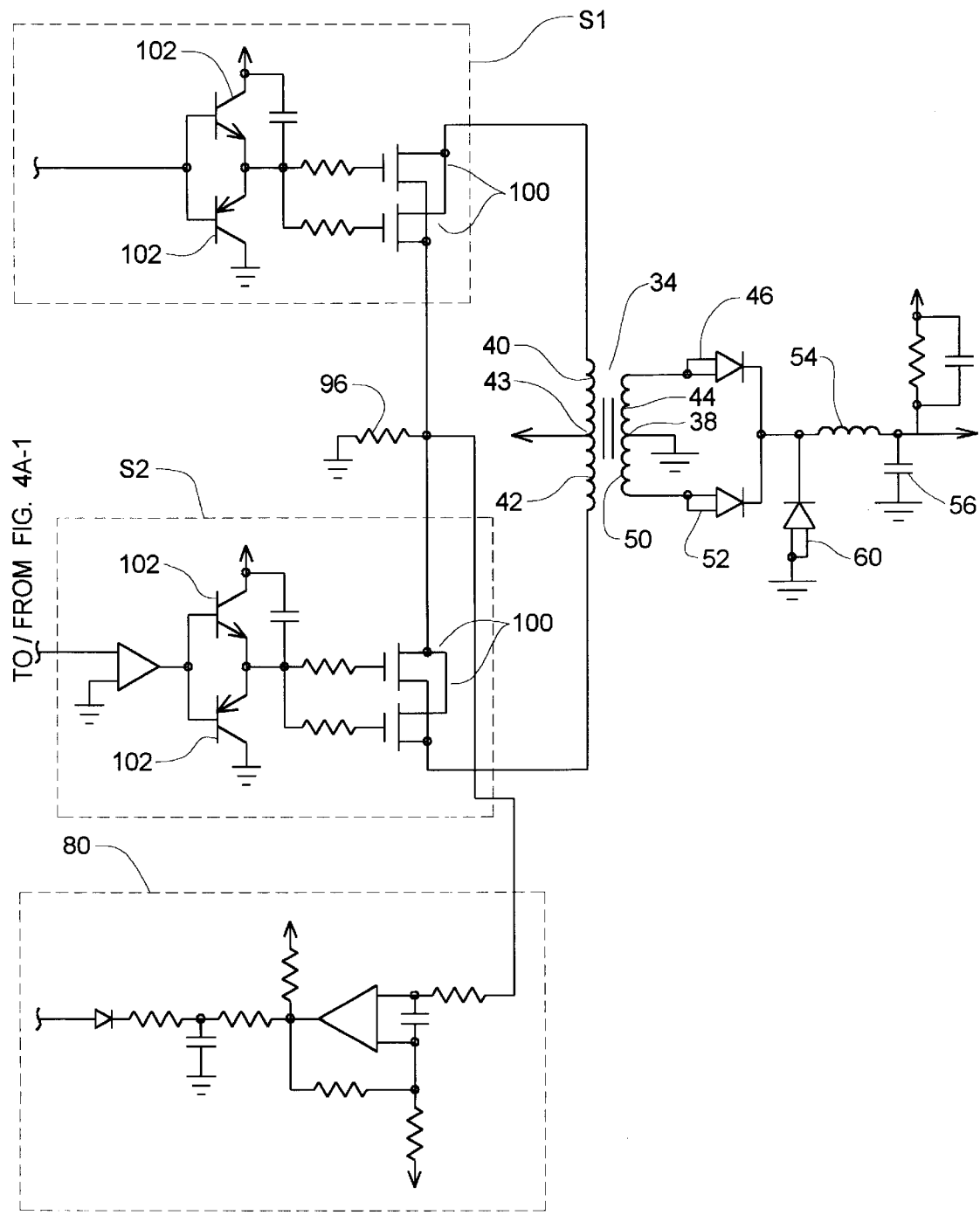

With the above description being given as a more general description, to describe the invention in more detail, reference is now made to FIGS. 3, 4A-1 and 4B-1, with FIG. 3 being a block diagram, and FIGS. 4A-1 and 4B-1 a circuit diagram illustrating in more detail the power section 12 of the present invention. As indicated previously, the two power sections 12 and 14 are nearly identical except that power section 12 provides the positive input to the amplifier 34 while the power section 14 provides the negative power input.

Figures 2, 4A:
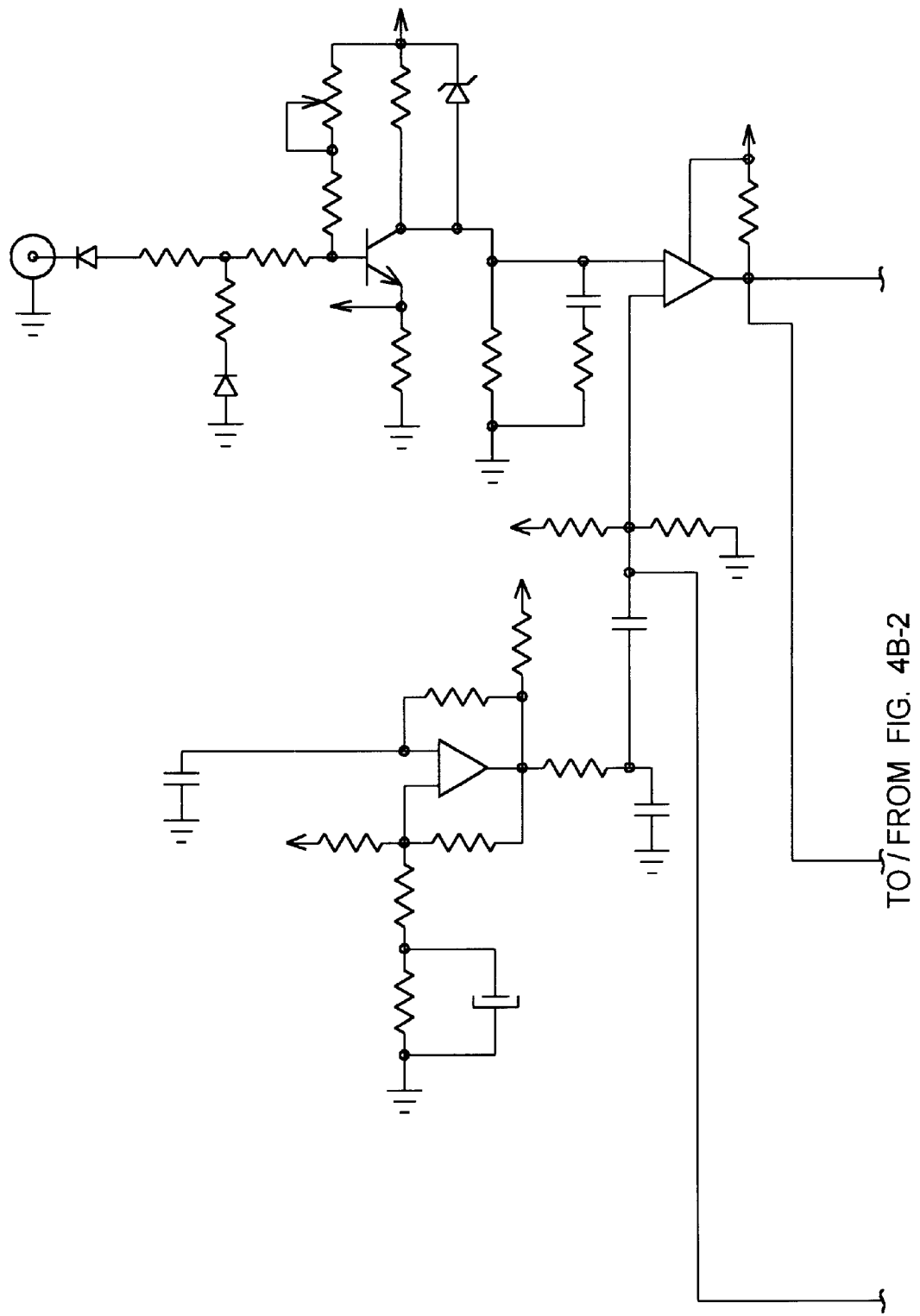
Figures 2, 4B:
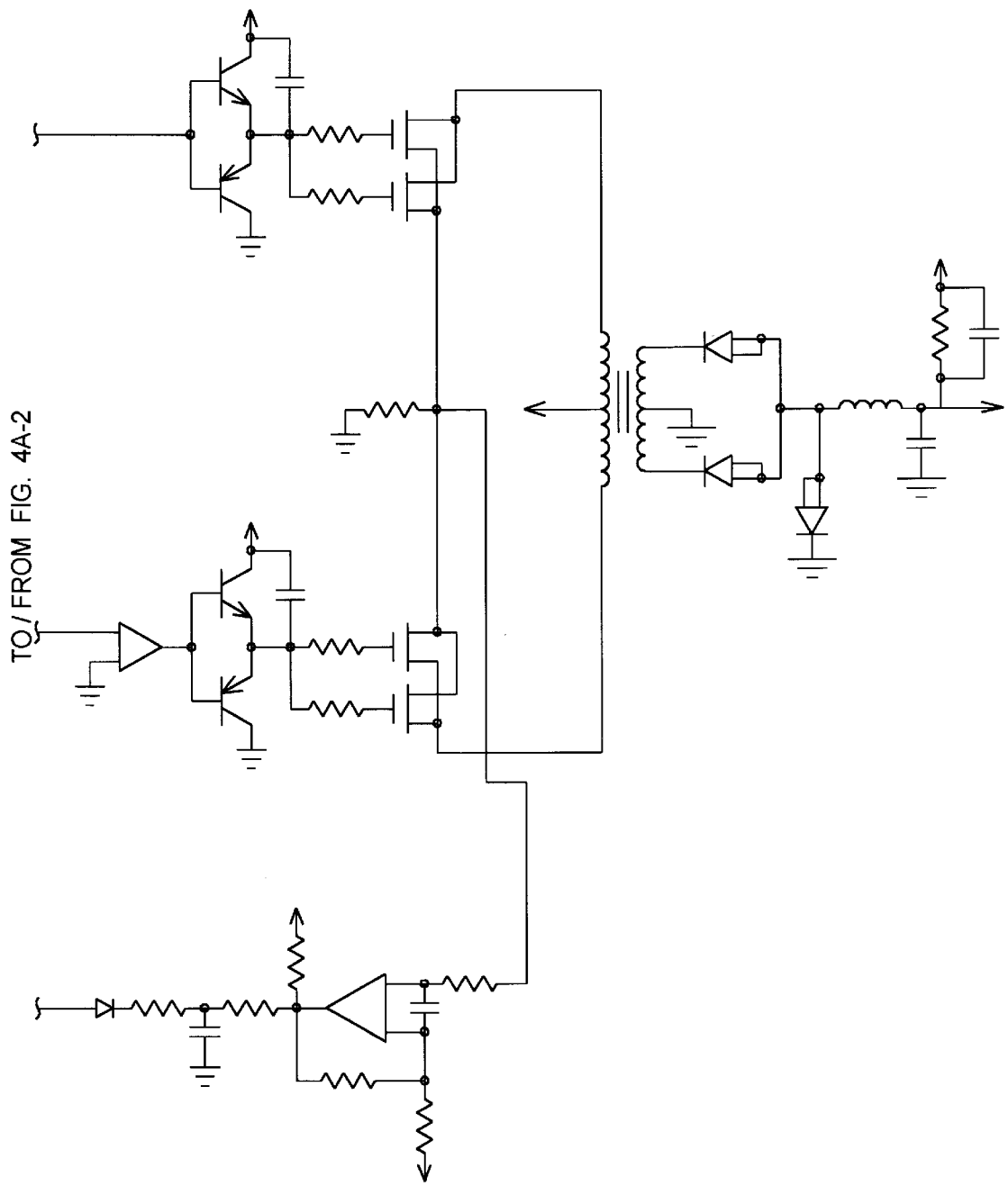

Accordingly, FIGS. 4A-2 and 4B-2 show the negative power supply section 14, and "a" suffixes are added to the numerical designations to distinguish the components of the power supply section 14 from those of power supply section 12. To relate FIG. 3 to FIG. 1, everything to the left of the transformer 34 in FIG. 1 appears in FIGS. 3 and 4.

With reference to FIG. 3, the switch S1 is controlled by the pulse width modulator 70. This pulse width modulator 70 sends a control signal to the switch S1, and sends the same signal to an inverter 72 which in turn sends a control signal to the switch S2. The control signal sent by the inverter 72 is of the same magnitude and width as that sent to the switch S1, except that the timing is such that these two control switches operate alternately. Thus, first the control pulse is transmitted to the switch S1, and then to the switch S2. Then the next, after which the control power pulse is transmitted to the switch S1, and then to the switch S2, etc. The pulse width modulator 70 in turn receives its input from two sources, namely the input amplifier 74 and the clock 76. The clock 76 sends regular pulses to the pulse width modulator 70 at 180 kHz. The input amplifier 74 is controlled by the audio input signal indicated 78.

The input amplifier 74 transmits an amplified signal to the pulse width modulator 70, this signal being is proportional to the amplitude of the audio input signal. The pulse width modulator 70 then transmits a series of pulses, the width of which is proportional to the amplitude of the audio input signal.

There is also an overcurrent limiter 80 which has an operative connection (indicated by the line 82) to the input line 84 of the clock to block the signal inputs from the clock.

With reference to FIG. 4A-1, the input signal to the input amplifier 74 enters through the diode D1 so that it is rectified so that only the positive going components of the audio signal are passed into the audio amplifier transistor 86, and the output from the transistor 86 is applied to the negative terminal 88 of the pulse width modulator 70.

The clock 76 is a comparitor operated with positive/negative feedback to make a series of pulses which are constant in amplitude and constant in duty cycle. This square wave pulse is integrated by a resistor 90 and a capacitor 92.

This turns the clock pulses into a series of triangle waves which are then applied to the plus terminal 94 of the pulse width modulator 22.

The overcurrent limiter comprises an overcurrent sensing resistor 96 (0.005 ohm) which senses the current passing through the transformer 34. If the current is too high, it will exceed a certain trip threshold which is set by a comparitor 98 of the overcurrent limiter 80.

The switch S1 comprises a pair of field effect transistors 100 which are in turn driven by a pair of bipolar transistors 102.

The negative power supply section 14 (shown in FIGS. 4A-2 and 4B-2) is constructed and operates in substantially the same way as the positive power supply 12, except that the diodes in the input amplifier 74 and the diodes 46a, 52a and 60a are reversed. Accordingly, there will be no detailed description of the circuitry of the power supply section shown in FIGS. 4A-2 and 4B-2.

Figure 5:
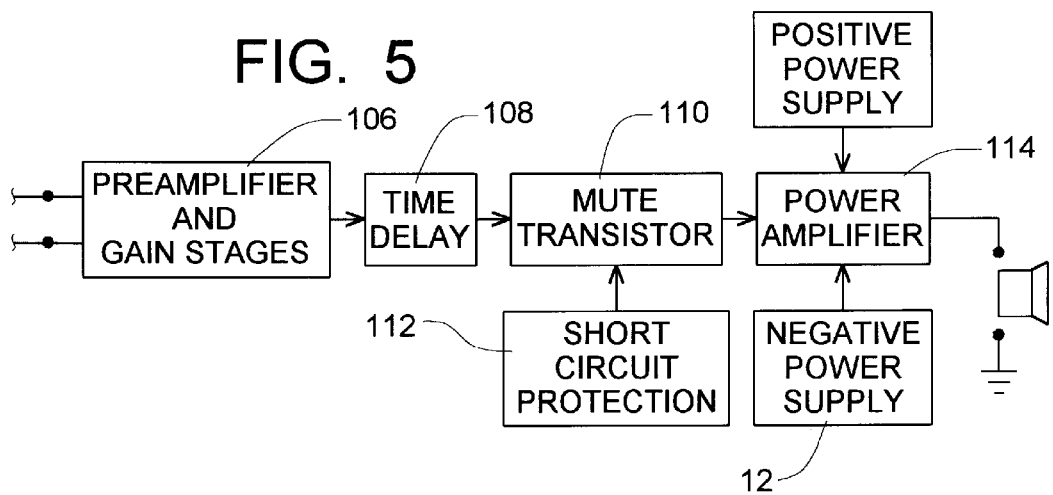
FIG. 5 is a schematic block diagram of the final amplifier section of the present invention.
Figure 6A:
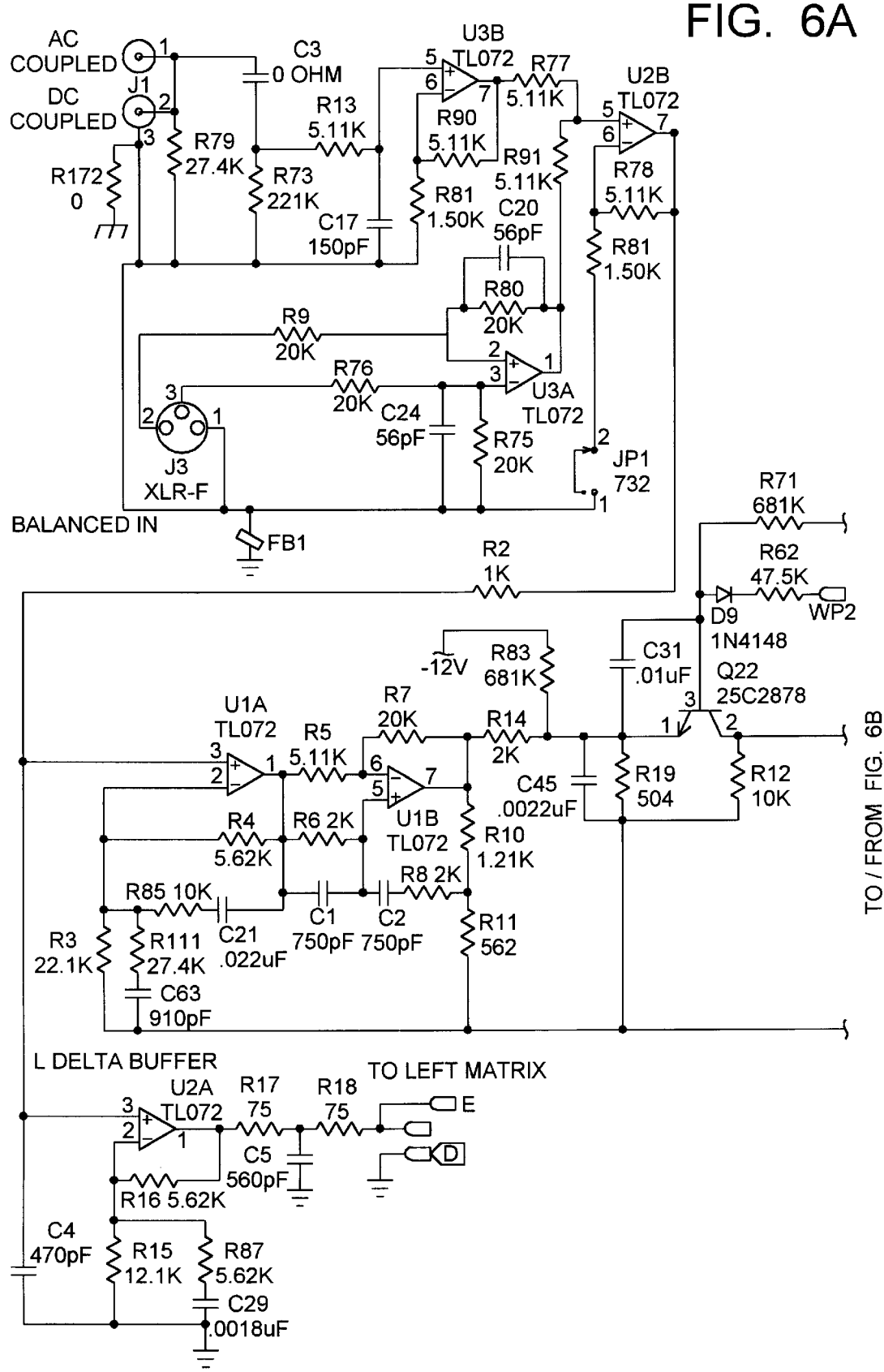

There will now be a description of the amplifier 16, and reference is made to FIG. 5 and FIGS. 6A, B, C and D. Conceptually, the amplifier is illustrated in the block diagram of FIG. 5 where there is shown a pre-amplifier and gain stage section 106, a time delay 108, a mute transistor 110, a short circuit protection circuit 112 which controls the mute transistor 110, and the final power amplifier section 114.

Figure 6B:
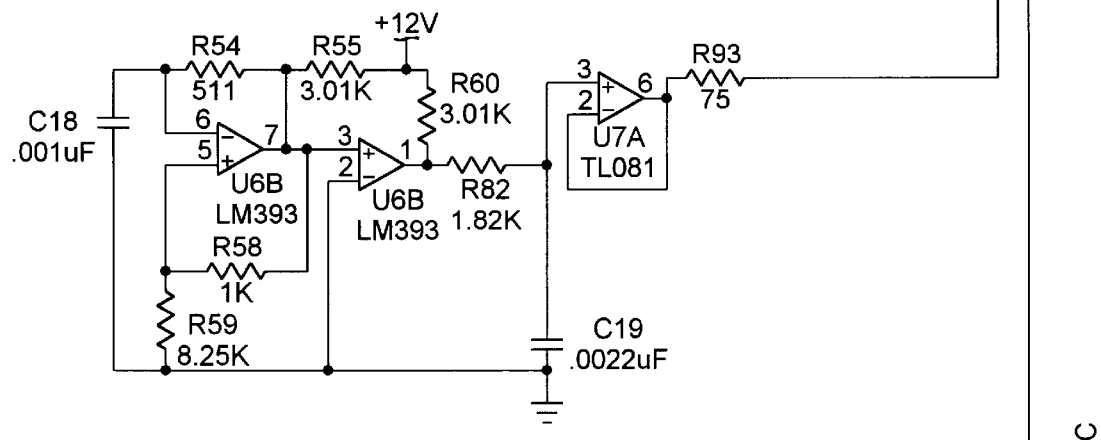
Figure 6B:
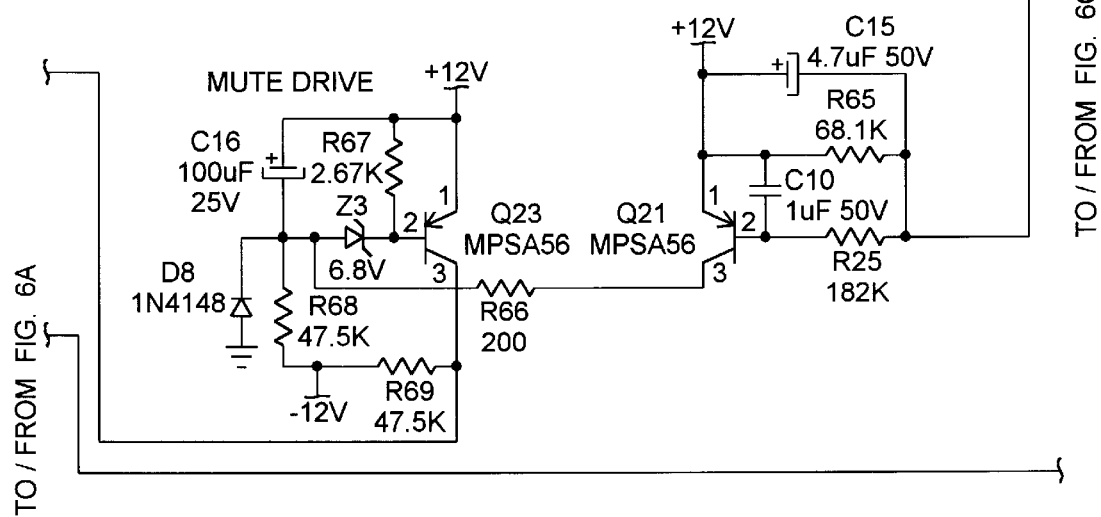
Figure 6B:
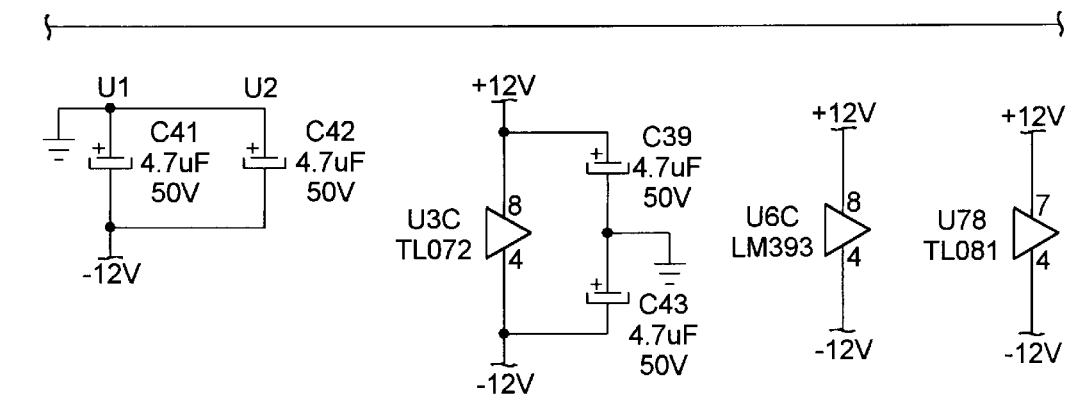
Figure 6C:
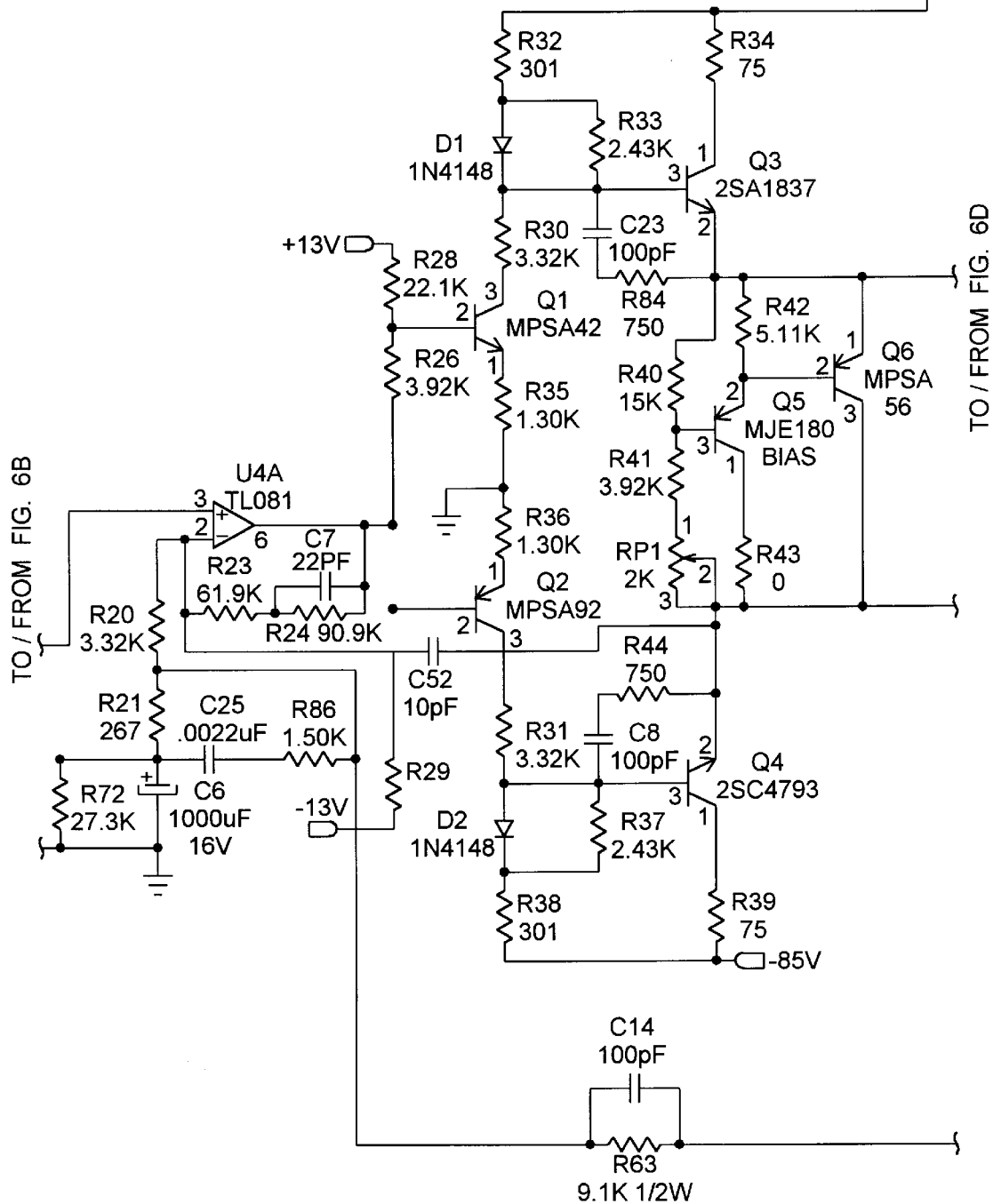
Figure 6E:
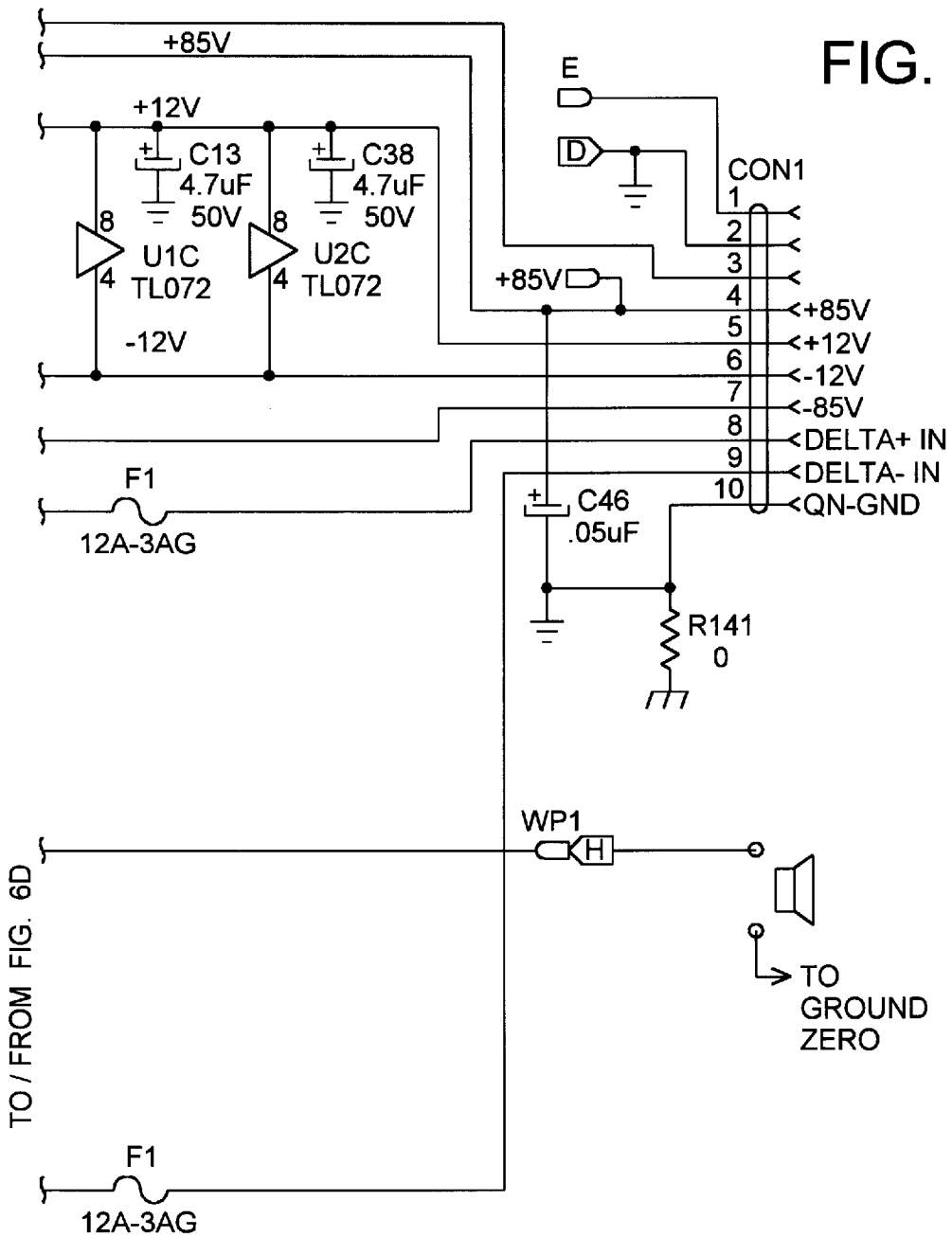

The specific circuitry of the amplifier is shown in FIG. 6A-D. In FIG. 6A there is shown the pre-amplifier and gain stages 106, and the mute transistor 110. In FIG. 6B, the short circuit protection circuit 112 is shown. The final power amplifier section 114 is shown in FIGS. 6C and 6D.

The input 116 to the pre-amplifier is an AC and DC coupled input which allows the use of pre-amplifiers which lack AC coupling. The input to the pre-amplifier goes through a series of three gain stages which together condition the signal so that the amplifier will clip properly. The output of the third gain stage goes to the time delay stage 108 which delays the signal approximately 10 microseconds. This is necessary because the power supply is slower than the amplifier, and since the signals need to be synchronized, there must be a time delay in the amplifier.

The output of the time delay goes through the mute transistor section, and the transistor itself is indicated at 118.

The output of this mute transistor 118 switches the amplifier on and off when it is plugged into the wall socket and when it is unplugged from the wall socket. When the amplifier is first plugged into the wall socket and powered up, the mute transistor holds the amplifier muted momentarily (about ¾ of a second). This allows the "thumps and bumps" that occur during power up not to be transmitted to the power amplifier. As indicated before, the circuitry for controlling the mute transistor is indicated at 112 in both FIG. 5 and also FIG. 6B.

The output from the mute transistor 110 goes to the input 120 of the final power amplifier. The power amplifier is shown in FIGS. 6C and 6D. Since this power amplifier is readily understandable from a review of the detailed circuit diagrams in FIGS. 6C and 6D, this will not be described in detail.

In the earlier part of this text, there has first been an overall description of the operation of the present invention with reference to FIGS. 1 and 2, a description of the mode of operation of the power sections 12 and 14 with reference to FIGS. 3, 4A-1, 4B-1,4A-2 and 4B-2, and also a description of the operation of the amplifier section with reference to FIGS. 5 and 6A-D. Therefore, those will not be repeated in detail, but only summarized. Then this will be followed by some general comments on the operation and advantages of the present invention.

The audio signal is simultaneously entered at three places in the overall system, namely at the two input diodes D1 and D2 which connect to the power sections 12 and 14, and also to the input 62 to the audio amplifier 16. The audio signal introduced to the two power sections 12 and 14 is used to enable these two power sections 12 and 14 to provide positive and negative power inputs to the amplifier 16 which are about 4 volts above and below, respectively, the positive and negative input terminals 58 and 58A to the amplifier 16.

More specifically, the audio signals transmitted into the diodes D1 and D2 are used in their respective power supply systems to control the width of the pulses transmitted from the pulse width modulators 22 and thus control the width of the pulses transmitted from the switches S1–S4 to the two transformers 34 and 34a of the two power sections 12 and 14. The operation by which this accomplished is described in more detail previously herein.

At this point, attention is now directed to the operation of each transformer 34 and 34a in connection with their related coil 54 and 54a and capacitor 56 and 56a. It should be kept in mind that the frequency of the pulses is 160 kHz, and audio signals are at 20 kHz or below. Let us now examine the operation of the power section 12. The pulses transmitted through the switches S1 and S2 are square wave pulses, and thus the pulses which are directed to the coil 54 are also square wave pulses. The capacitor 56 is maintained at a voltage which tracks the voltage of the audio signal, and more specifically is about 4 volts above that of the audio signal.

Let us assume that at a certain instant, the capacitor 56 is at 25 volts, and the audio signal very abruptly increases in amplitude. This same audio signal would be sending its inputs to the pulse width modulators 70 and 70a of the two power sections 12 and 14, so that the width of the pulse is being transmitted through the transformer 34 would also increase in width. As these pulses are transmitted through the coil 54, the voltage of the current passing from the coil 54 rises above the voltage level in the capacitor 56 so as to change the capacitor 56 to a higher voltage.

At the same time, however, since the amplifier is now drawing more current, electrons are being drawn away from the capacitor 56. There is a feedback loop which provides a proper control so that if the voltage level at the capacitor 56 drops below the desired level, then the pulse width modulators 70 and 70a increase the width of the pulses yet further. On the other hand, if the voltage on the capacitor 56 is going above the desired level (i.e. greater than approximately 4 volts above the audio signal), then the feedback loop would cause the pulse width modulator 70 or 70a to send pulse signals of narrower width. The net result is that the voltage at the capacitor 56 or 56a is changed in very short time increments so that the voltage level at the capacitors 56 and 56a of the two power supply sections 12 and 14 changes rapidly and accurately so that they are able to track the audio signal very closely.

It has been found that this amplifier 10 is able to operate at very high power output (2,000 watts or more) and operate very efficiently so that relatively little heat is dissipated. Also, the power supply is designed so that its size and weight can be greatly reduced relative to prior art tracking amplifiers of comparable power output.

It is to be understood that various modifications can be made and be within the scope of the present invention.

I claim:

1. An audio amplifier comprising:
   a) a power amplifier section which receives an audio input signal and positive and negative voltage power inputs to produce an audio output;
   b) a power supply comprising a positive power supply section and a negative power supply section;
   c) said positive power supply section comprising;
      i. a first transformer having a primary and a secondary winding, with the secondary winding being operatively connected to said power amplifier section to supply positive voltage power input to the power amplifier section;
      ii. a first power switching portion to supply current pulses to the primary winding;
      iii. a first filter circuit component connected to an output of said secondary winding of the first transformer to maintain the voltage of the positive power output as a continuing variable voltage input;
   d) said negative power supply section comprising:
      i. a second transformer having a primary and a secondary winding, with the secondary winding being operatively connected to said power amplifier section to supply negative voltage power input to the power amplifier section;
      ii. a second power switching portion to supply current pulses to the primary winding;
      iii. a second filter circuit component connected to an output of said secondary winding of the second transformer to maintain the voltage of the negative power output as a continuing variable voltage input;
   e) a control circuit responsive to an audio input signal to transmit pulse control signals to the first and second switching portions to cause said first and second switching portions to open and close in a manner to transmit current pulses to the primary windings of the first and second transformers, with power of the pulses having a proportional relationship to the strength of the audio signal, so that the positive and negative voltage power inputs to the amplifier section tracks the audio signal in a manner to maintain the positive and negative voltage power inputs at a predetermined level range above and below voltage of the audio input.

2. The amplifier as recited in claim 1, wherein the switching portion for each of said positive and negative supply sections comprises two switches, connected to opposite sides of the primary winding of the related transformer, so that the pulses of one of said switches passes through the related primary winding of one direction, while the pulses of the other switch pass through the related primary winding in an opposite direction.

3. The amplifier as recited in claim 2, wherein an intermediate portion of each of said primary windings is connected to a power source.

4. The amplifier as recited in claim 3, wherein the secondary winding of each transformer is connected to ground at an intermediate location of each secondary winding.

5. The amplifier as recited in claim 2, wherein the secondary winding of each transformer is connected to ground at an intermediate location of each secondary winding.

6. The amplifier as recited in claim 1, wherein the control circuit comprises a pulse width modulator which receives a clock input to initiate successive pulse signals, and having an audio signal input to cause said pulse width modulator to transmit pulse signals having a pulse strength with a proportional relationship to said audio signal.

7. The amplifier as recited in claim 6, wherein each pulse width modulator creates square wave signal pulses, with the width of the pulses varying in accordance with the amplitude of the audio signal.

8. The amplifier as recited in claim 6, wherein the switching portion for each of said positive and negative supply sections comprises two switches, connected to opposite sides of the related primary winding of the transformer, so that the pulses of one of said switches passes through the related primary winding in one direction, while the pulses of the other switch pass through the related primary winding in an opposite direction, said control circuit comprises a pulse width modulator which receives a clock input to initiate successive pulse signals, and having an audio signal input to cause said pulse width modulator to transmit pulse signals having a pulse strength with a proportional relationship to said audio signal.

9. The amplifier as recited in claim 1, wherein each secondary winding has two end connections and first and second diodes to receive the output at each of said end connections with the output of the diodes being directed to the power amplifier section.

10. The amplifier as recited in claim 9, wherein the switching portion for each of said positive and negative supply sections comprises two switches, connected to opposite sides of the primary winding of the transformer, so that the pulses of one of said switches passes through the primary winding in one direction, while the pulses of the other switch pass through the primary winding in an opposite direction, said control circuit closes the first and second switches of each of said supply power sections alternately, so that current pulses from said secondary winding are transmitted alternately through said first and second diodes.

11. The amplifier as recited in claim 9, wherein each of the filter components of the two power supply sections comprises an induction coil to receive the output of the secondary, and a capacitor connected at a location between the induction coil and the amplifier section.

12. The amplifier as recited in claim 1, wherein each of the filter circuit components of the two power supply sections comprises an induction coil to receive the output of the secondary, and a capacitor connected at a location between the induction coil and the amplifier section.

13. A method of amplifying an audio signal, comprising:
  a. providing a power amplifier section having an audio input signal port and positive and negative voltage power input ports;
  b. providing a power supply comprising a positive power supply section and a negative power supply section where said positive power supply section comprises:
    i. a first transformer having a primary and a secondary winding, with the secondary winding being operatively connected to said power amplifier section;
    ii. a first power switching means operatively connected to the primary winding;
    iii. a first filter circuit component connected to an output of said secondary winding of the first transformer;
  and wherein said negative supply power section comprises:
    i. a second transformer having a primary and a secondary winding, with the secondary winding being operatively connected to said power amplifier section to supply negative voltage power input to the power amplifier section;
    ii. a second power switch means to supply current pulses to the primary winding;
    iii. a second filter circuit component connected to an output of said secondary winding of the second transformer to maintain the voltage of the negative power output as a continuing variable voltage input;
  c. transmitting pulse control signals to the first and second switching portions to cause the first and second switching portions to open and close in a manner to transmit current pulses to the primary winding of the first and second transformers, with power of the pulses having a proportional relationship to the strength of the audio signal, so that the positive and negative voltage power inputs to the amplifier section track the audio signal in a manner to maintain the positive and negative input voltages at a predetermined level range above and below, respectively, the voltage of the audio input.

14. The method as recited in claim 13, wherein the switching portion for each of said positive and negative supply sections comprises two switches, connected to opposite sides of the primary winding of the related transformer, said method comprising transmitting pulses of one of said switches passes through the related primary winding in one direction, and the pulses of the other switch through the related primary winding in an opposite direction.

15. The method as recited in claim 14, wherein an intermediate portion of each of said primary windings is connected to a power source.

16. The method as recited in claim 15, wherein the secondary winding of each transformer is connected to ground at an intermediate location of each secondary winding.

17. The method as recited in claim 13, wherein said pulse control signals are generated by a pulse width modulator which receives a clock input to initiate successive pulse signals, and providing an audio signal input to cause said pulse width modulator to transmit pulse signals having a pulse strength with a proportional relationship to said audio signal, and the pulse width modulator creates square wave signal pulses, with the width of the pulses varying in accordance with the amplitude of the audio signal.

18. The method as recited in claim 13, wherein each secondary winding has two end connections and first and second diodes to receive the output at each of said end connections with the output of the diodes being directed to the power amplifier section.

19. The method as recited in claim 18, wherein the switching portion for each of said positive and negative supply sections comprises two switches, connected to opposite sides of the primary winding of the transformer, so that the pulses of one of said switches passes through the primary winding in one direction, while the pulses of the other switch pass through the primary winding in an opposite direction, each control circuit closes the first and second switches of each of said supply power sections alternately, so that current pulses from said secondary winding are transmitted alternately through said first and second diodes.

20. The method as recited in claim 19, wherein each of the filter components of the two power supply sections comprises an induction coil to receive the output of the secondary, and a capacitor connected at a location between the induction coil and the amplifier section.

* * * * *